United States Patent
Liao et al.

(10) Patent No.: US 6,814,927 B2
(45) Date of Patent: Nov. 9, 2004

(54) FABRICATION METHOD OF NANOSTRUCTURED TUNGSTEN CARBIDE BULK MATERIAL

(75) Inventors: Shih-Chieh Liao, Taoyuan (TW); Song-Wein Hong, Changhua (TW); Geoffrey Wen Tai Shuy, Taipei (TW); Jin-Ming Chen, Taoyuan (TW); Thiraphat Vilaithong, Chiang Mai (TH); Lang Deng Yu, Chaing Mai (TH)

(73) Assignee: Industrial Technology Research Institute, Hsinchu (TW)

(*) Notice: Subject to any disclaimer, the term of this patent is extended or adjusted under 35 U.S.C. 154(b) by 26 days.

(21) Appl. No.: 10/294,748

(22) Filed: Nov. 15, 2002

(65) Prior Publication Data

US 2003/0226423 A1 Dec. 11, 2003

(30) Foreign Application Priority Data

Jun. 11, 2002 (TW) .......................... 91112696 A

(51) Int. Cl.[7] ................................................ B22F 3/24
(52) U.S. Cl. ............................ 419/18; 419/26; 148/212; 148/900
(58) Field of Search ................................. 148/212, 900, 148/210; 419/18, 26, 27; 75/240

(56) References Cited

U.S. PATENT DOCUMENTS

| | | | | |
|---|---|---|---|---|
| 4,105,443 A | * | 8/1978 | Dearnaley et al. | 75/238 |
| 4,640,169 A | * | 2/1987 | Fromson et al. | 83/685 |
| 4,696,829 A | * | 9/1987 | Legg | 427/527 |
| 5,038,645 A | * | 8/1991 | Walter et al. | 82/1.11 |
| 5,352,269 A | | 10/1994 | McCandlish et al. | 75/351 |
| 5,507,760 A | * | 4/1996 | Wynne et al. | 606/159 |

* cited by examiner

*Primary Examiner*—Ngoclan T. Mai
(74) *Attorney, Agent, or Firm*—Birch, Stewart, Kolasch & Birch, LLP

(57) ABSTRACT

A nanostructured tungsten carbide bulk material, sintered from tungsten carbide and metal such as cobalt nanopowders, comprises a tungsten carbide and a metallic binder such as cobalt phases. The tungsten carbide phase has nanostructures comprising a plurality of dislocations, twins, stacking faults, dislocation cells, nano-subgrains with preferred orientation or texture, or a combination thereof.

6 Claims, 8 Drawing Sheets

FABRICATION METHOD OF NANOSTRUCTURED TUNGSTEN CARBIDE BULK MATERIAL

BACKGROUND OF THE INVENTION

1. Field of the Invention

The present invention relates in general to a nanostructured tungsten carbide material, and particularly to a nanostructured tungsten carbide-cobalt composite material and a method of fabricating the same.

2. Description of the Related Art

The synthesis and processing of nanophase or nanostructured materials, i.e. materials with grain sizes less than about 100 nm, is currently of great interest because these materials have properties different from and often superior to those of their conventional counterparts.

Nano-powders have been produced using synthesis methods such as electrodeposition, melt spun, plasma, chemical/physical vapor condensation, chemical precipitation, sol-gel and hydrothermal processings. Cemented tungsten carbide powders with nano-sized grains have been produced using the spray conversion process (SCP) disclosed in McCandlish U.S. Pat. No. 5,352,269 entitled "Spray Conversion Process for the Production of Nanophase Composite Powders". WC—Co materials are often used for cutting and drilling tool applications because of superior hardness and wear resistance. Nanostructured WC—Co materials have much better mechanical properties than their conventional counterparts. However, there exist problems with the consolidation of the nanostructured WC powders with retention of WC nano-grains. This is because the WC nano-grains grow rapidly during sintering.

SUMMARY OF THE INVENTION

It is an object of the present invention to provide a nanostructured tungsten carbide bulk material with ultrafine surface and good mechanical properties, such as high hardness, fracture toughness and wear resistance.

According to the present invention, the nanostructured tungsten carbide bulk material, sintered from tungsten carbide and metal such as cobalt nano-powders, comprises a tungsten carbide and a metallic binder such as cobalt phases. The sub-surface region of the tungsten carbide phase in the tungsten carbide/cobalt bulk has nanostructures comprising a plurality of dislocations, twins, stacking faults, dislocation cells, nano-subgrains with preferred orientation or texture, or a combination thereof.

It is another object of the present invention to provide a method of fabricating a nanostructured tungsten carbide bulk material.

The method comprises the following steps. First, the tungsten carbide and cobalt nano-powders were preferably mixed and milled with lubricants, binders, and grain growth inhibitors for a long time. The finer the powder, the more binders and lubricants as well as the longer time are needed. The milled powders were then pressed into the compacts. Following conventional sintering techniques for WC—Co, the compacts were first subjected to dewaxing and degassing in the presintering stage, followed by liquid phase sintering above a eutectic temperature for 60–100 min. Due to the large surface area of the tungsten carbide nano-powder, a relatively large amount of oxygen is absorbed onto the nano-powder. Therefore, in the presintering stage, the compacts were heated in flowing H2 atmosphere at about 800~900° C. to remove the absorbed oxygen. During the sintering process, special care was taken to maintain the carbon-balance in the samples to prevent excess carbon from dissolving into the liquid cobalt during sintering. If excess carbon dissolves in cobalt during liquid phase sintering, phases such as $W_2C$ with poor mechanical properties can be formed. In the end of the process, the sintered compacts were sinter-HIPed with an argon pressure of 800 psi, for example, to further reduce porosity level in the sintered parts. Prior to ion implantation, sintered compacts were polished using diamond suspension (1 $\mu$m particle size) to a mirror surface. Finally, ion implantation comprising C−, N+, O2−, Ar+, or a combination thereof is preferably performed on the cemented tungsten carbide bulk at a pressure of $5*10^{-4}$ psi below 100° C., thus nanostructures are formed in the sub-surface region of the tungsten carbide phase, wherein the nanostructures comprise a plurality of dislocations, twins, stacking faults, dislocation cells, nano-subgrains with preferred orientation or texture, or a combination thereof. The dosage of the ion implantation is in the range of $10^{15}$ to $10^{30}$ ions/cm$^2$.

BRIEF DESCRIPTION OF THE DRAWINGS

The above and other objects, features, and advantages of the present invention will become apparent from the following detailed description of preferred embodiments of the invention explained with reference to the accompanying drawings, in which.

DETAILED DESCRIPTION OF THE INVENTION

Figure 1:
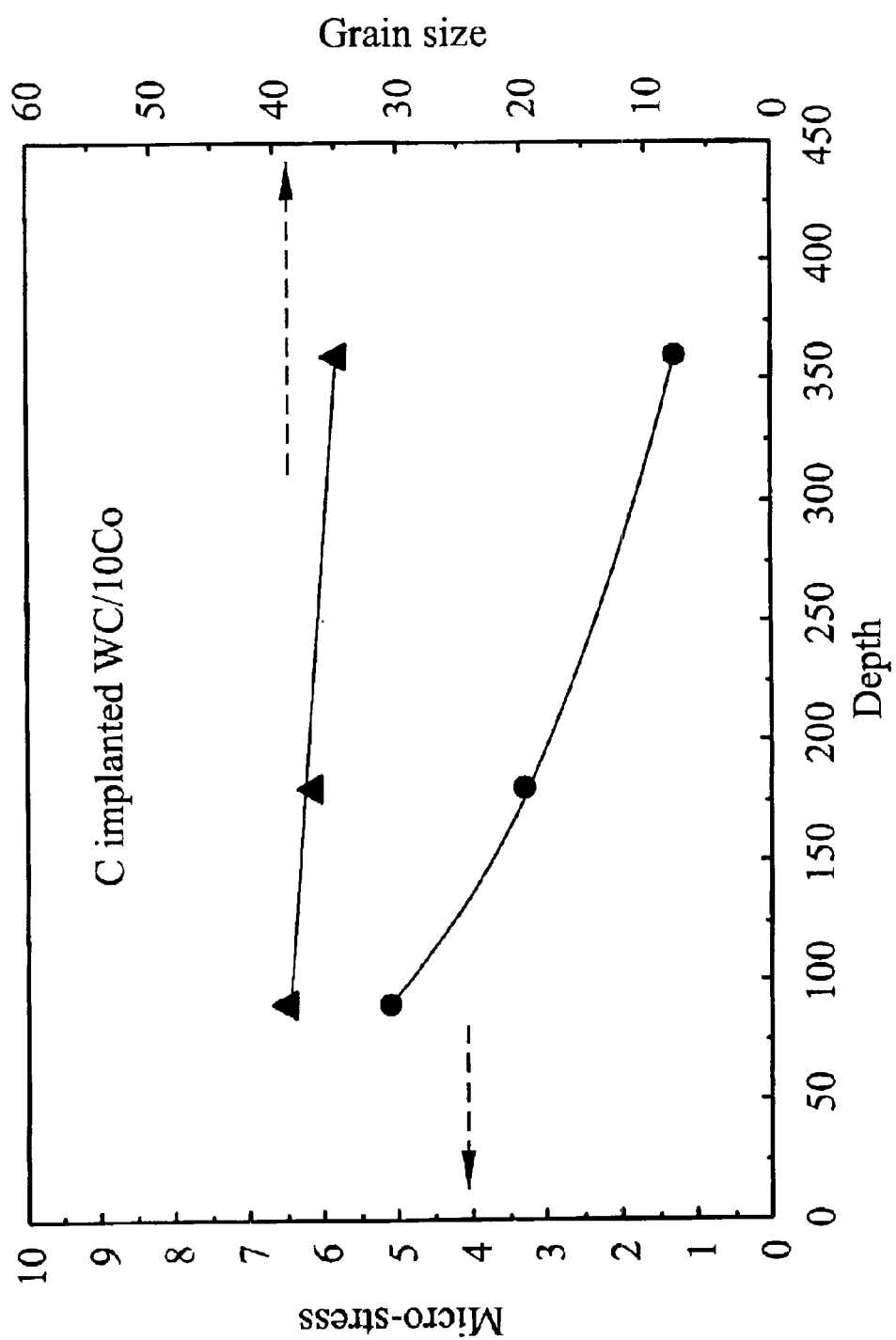
FIG. 1 is a schematic drawing illustrating the microstress and grain size as a function of the implantation depth for the carbon-implanted nano-WC/10 wt. % Co according to the preferred embodiment of the present invention.

There will now be described an embodiment of this invention with reference to the accompanying drawings.

First, lubricants, binders, and grain growth inhibitors are preferably mixed and milled with the tungsten carbide— cobalt nano-powders for a long time. The finer the powder, the more binders and lubricants as well as the longer time are needed.

The milled powders were then pressed into the compacts. Following conventional sintering techniques for WC—Co, the compacts were first subjected to dewaxing and degassing in the presintering stage, followed by liquid phase sintering above a eutectic temperature for 60–100 min. Due to the large surface area of the tungsten carbide nano-powder, a relatively large amount of oxygen is absorbed onto the nano-powder. Therefore, in the presintering stage, the compacts were heated in flowing H2 atmosphere at about 800~900° C. to remove the absorbed oxygen. During the sintering process, special care was taken to maintain the carbon-balance in the samples to prevent excess carbon from dissolving into the liquid cobalt during sintering. If excess carbon dissolves in cobalt during liquid phase sintering, phases such as $W_2C$ with poor mechanical properties can be formed. In the end of the process, the sintered compacts were sinter-HIPed with an argon pressure of 800 psi, for example, to further reduce porosity level in the sintered parts.

Prior to ion implantation, diamond (1 μm particle size) polishing is preferably performed until a mirror surface appears on the tungsten carbide bulk.

Finally, ion implantation comprising C−, N+, O2−, Ar+, or a combination thereof is performed on the tungsten carbide bulk at a pressure of $5*10^{-4}$ psi below 100° C., thus nanostructures are formed in the sub-surface region of tungsten carbide phase of the tungsten carbide—cobalt bulk, wherein the nanostructures comprise a plurality of dislocations, twins, stacking faults, dislocation cells, nano-subgrains with preferred orientation or texture, or a combination thereof. The dosage of the ion implantation is about $10^{15}$~$10^{30}$ ions/cm$^2$. The depth of the sub-surface is from a few tenths to about 500 nanometers, depending on the implanted ions and accelerating voltage. Microstress in the sub-surface is about 1~10 GPa. After the ion implantation, surface hardness of the nanostructured WC—Co material increases significantly while the friction coefficient decreases. The ductile fracture wear suggests that the wear resistance of the implanted nano-WC/Co material is improved. As well, the surface roughness of the implanted nano-WC/Co material is less than 15 nanometers.

The ion implantation process induces considerable compressive stress up to 10 GPa and nanostructures comprising a large number of dislocations, twins, stacking faults, dislocation cells, and nano-subgrains with preferred orientation in the sub-surface region of the WC phase of the WC/Co bulk, resulting in favorable mechanical properties.

Through nanoindentaion testing, we found that ion implantation process increased surface hardness up to 29 GPa, but decreased surface elastic-modulus. Besides, a layer (about 120 nm thick) rich in carbon and implanted ions can be formed in the subsurface. Grazing incidence x-ray diffraction (GIXRD) analysis of the subsurface showed first no evidence of the formation of new compounds, and secondly peak broadening that is attributed to the WC nano-grains (as small as 40 nm) and the micro-stress (greater than 5 GPa).

FIG. 1 illustrates the microstress and the grain size as a function of the implantation depth for the carbon-implanted nano-WC/10 wt. % Co. The result shows that the WC grain sizes do not change with the depth and are approximately 40 nm, and a large amount of microstress (greater than 5 GPa) is introduced into the nanostructured WC phase but decreases quickly with depth.

Figure 2:
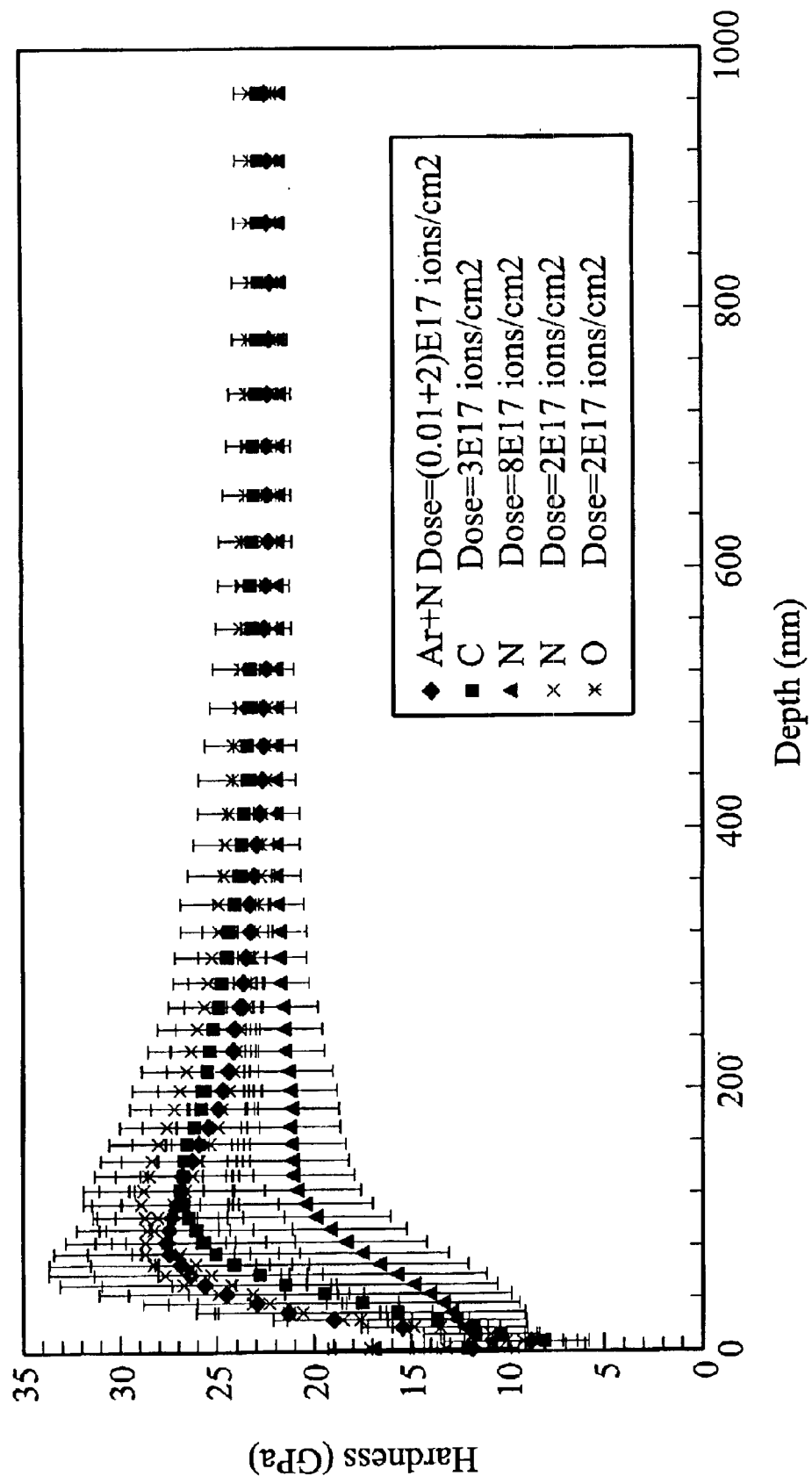
FIG. 2 is a schematic drawing illustrating the surface hardness as a function of the implantation depth of WC/10 wt. % Co samples implanted with various species and dosages of ions according to the preferred embodiment of the present invention.

FIG. 2 shows the surface hardness as a function of the implantation depth of the nanostructured WC/10 wt. % Co materials implanted with various species and dosages of ions. The result clearly indicates that the hardness is significantly enhanced by the ion implantation. The surface hardness of the nanostructured WC/Co materials implanted by oxygen and by a low dosage of nitrogen ions are especially and markedly enhanced.

Figure 3:
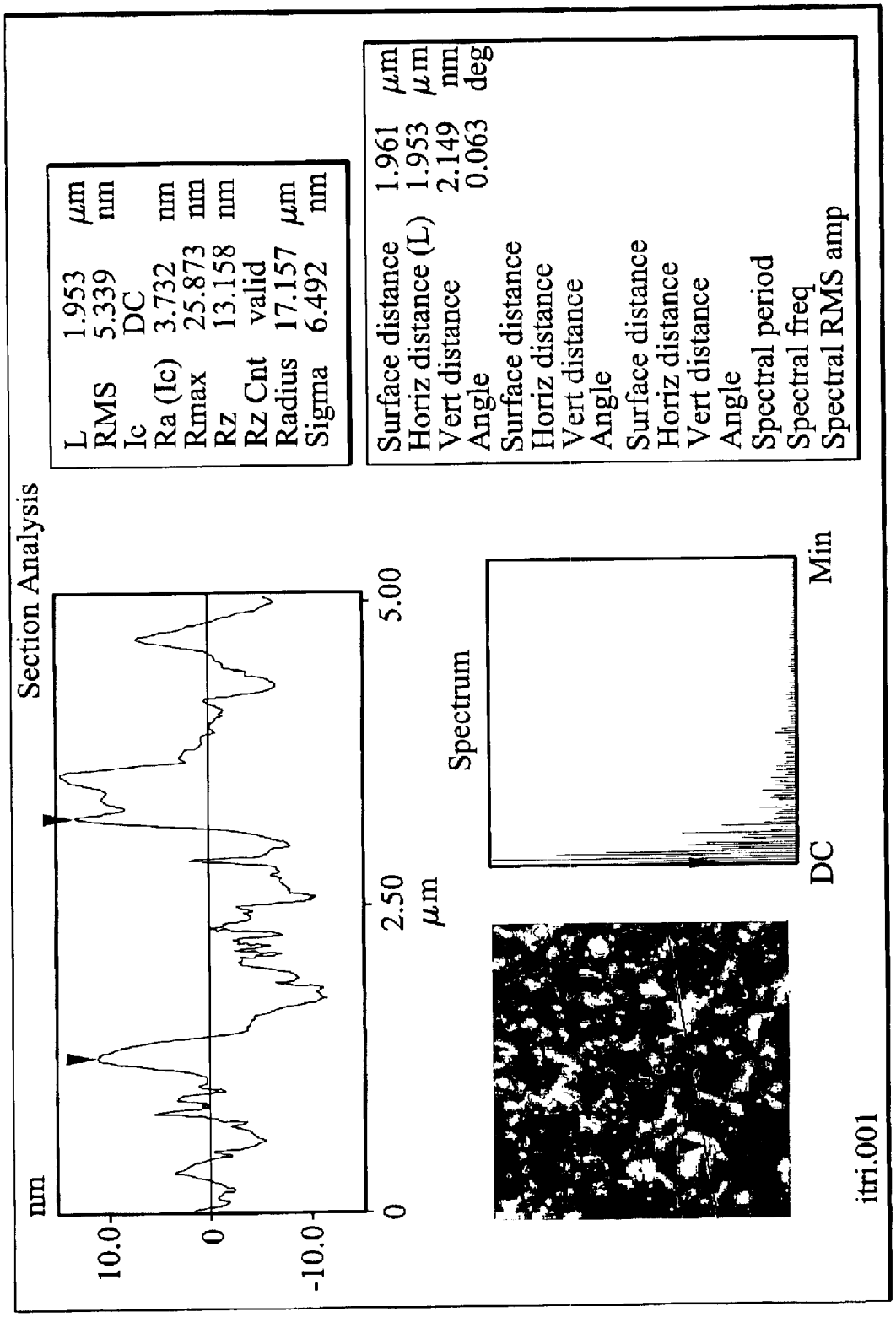
FIG. 3 is a schematic drawing illustrating the atomic force microscope (AFM) analysis result of the carbon-implanted WC/10 wt. % Co according to the preferred embodiment of the present invention.

As well, average surface roughness of the carbon-implanted nano-WC/10 wt. % Co material measured by the AFM is low as 3.5 nm, as shown in FIG. 3. The surface of the nanostructured WC/Co material is extremely fine and smooth.

Figure 4:
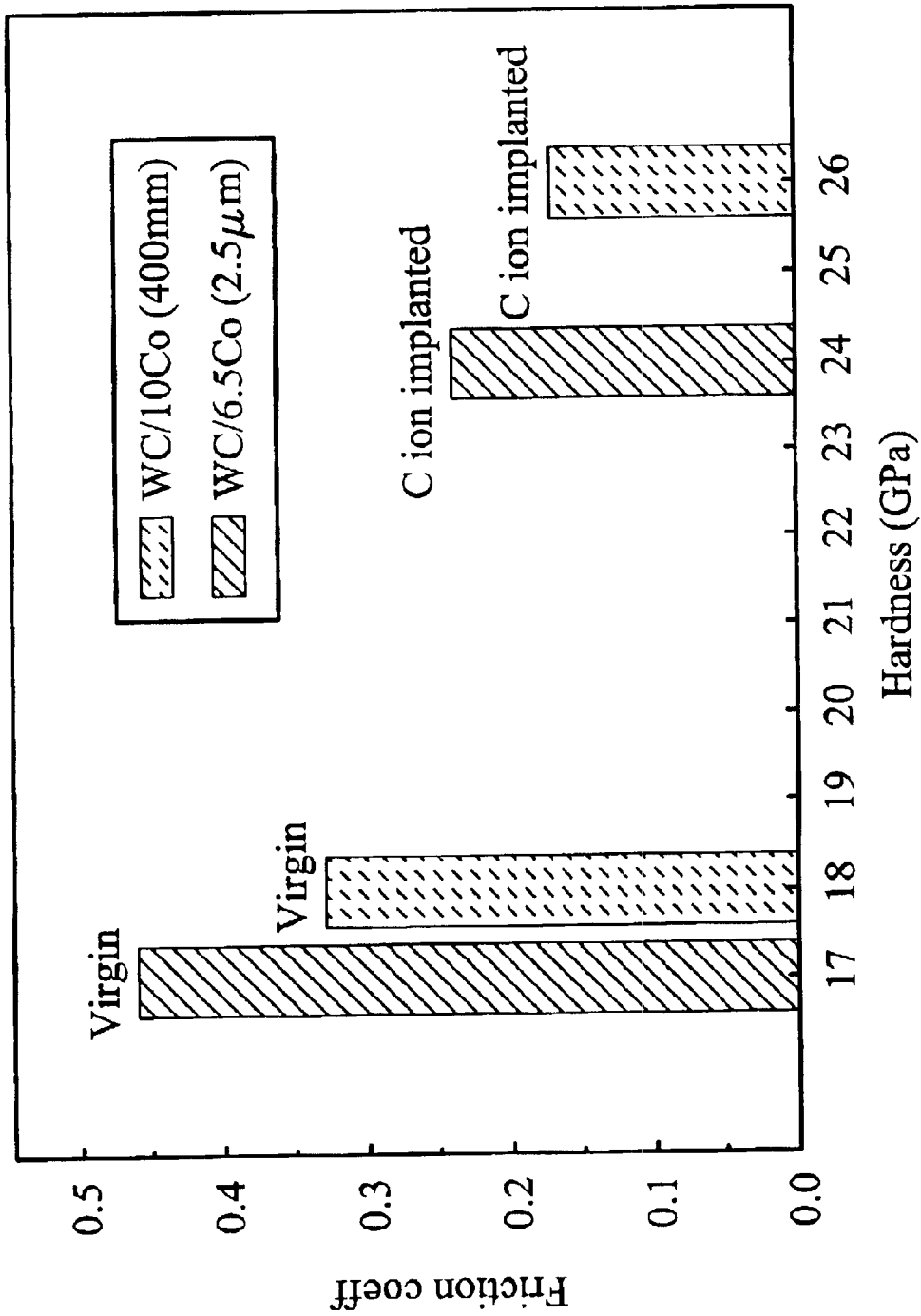
FIG. 4 is a schematic drawing illustrating the comparison of the hardness and the friction coefficient between the WC/6.5 wt. % Co(WC grain size=2.5 $\mu$m) and the WC/10 wt. % Co (WC grain size=400 nm) before and after the carbon implantation according to the preferred embodiment of the invention.

The comparison of the friction coefficient and the hardness between the WC/6.5 wt. % Co (WC grain size=2.5 μm) and the WC/10 wt. % Co (WC grain size=400 nm) before and after the carbon implantation are shown in FIG. 4. As the grain size is reduced or the application of ion implantation, the surface hardness increases, while the friction coefficient decreases.

Figure 5A:
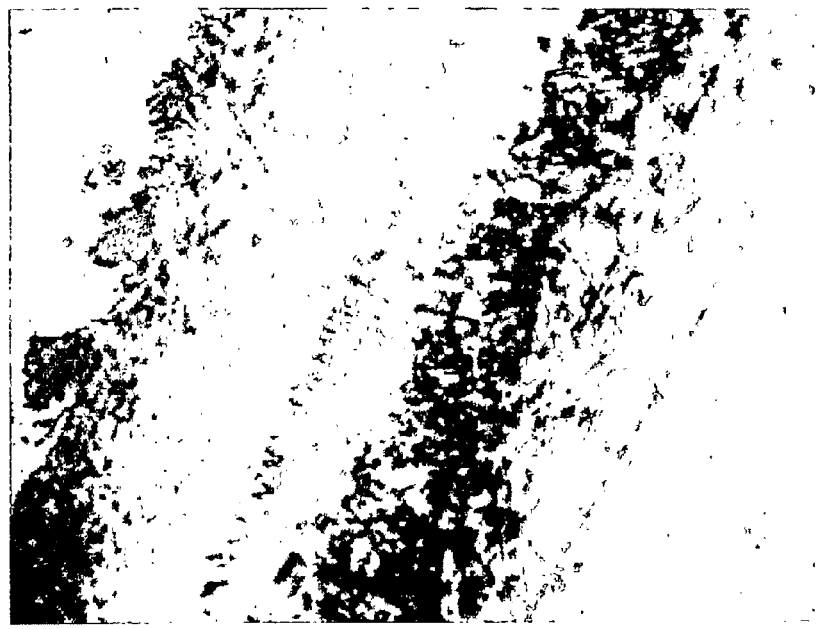
FIGS. 5a and 5b are the scanning electron microscope (SEM) pictures of the worn surface of the WC/10 wt. % Co showing a brittle fracture according to the preferred embodiment of the invention.
Figure 5B:
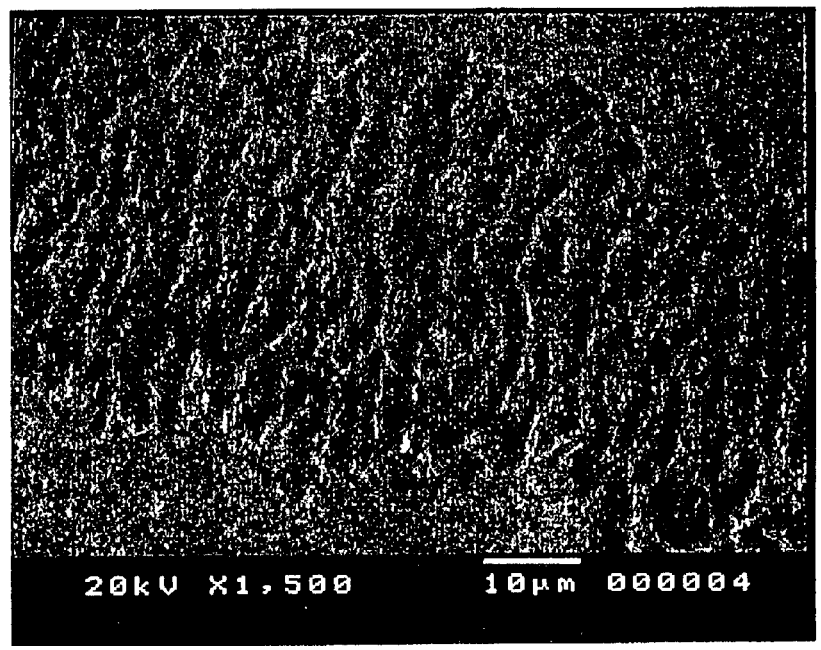
Figure 5C:
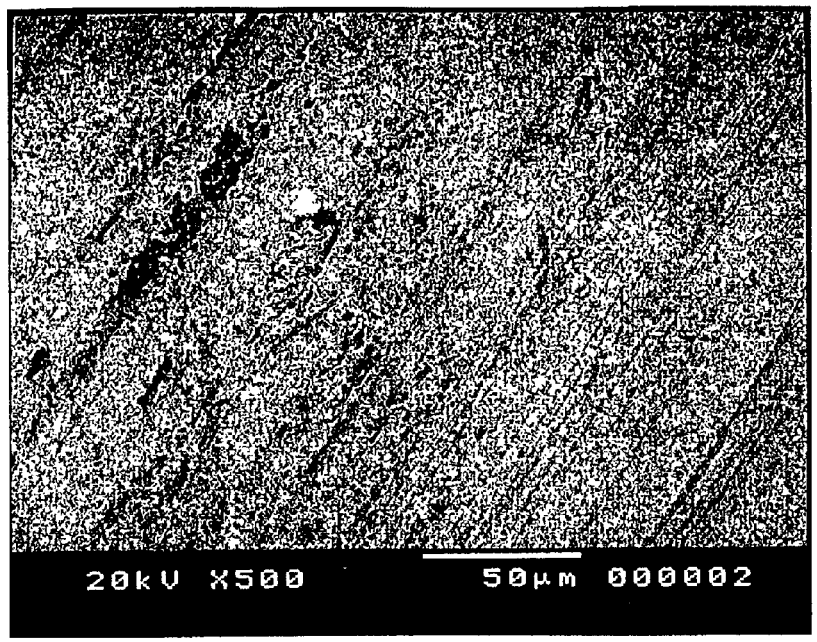
FIGS. 5c and 5d are the SEM pictures of the worn surface of the carbon-implanted WC/10 wt. % Co showing a ductile fracture according to the preferred embodiment of the invention.
Figure 5D:
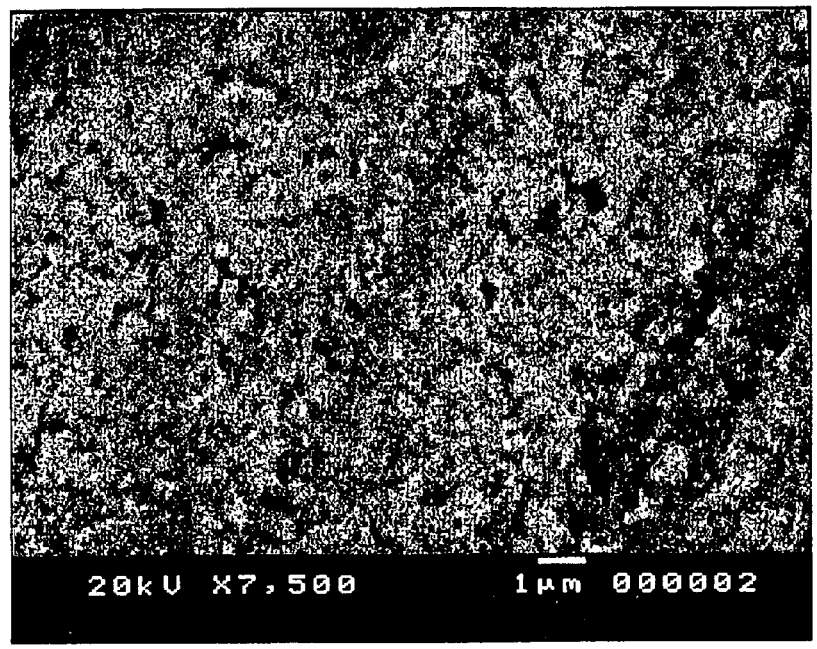

The surface structure and topography are respectively investigated by the TEM and the SEM. FIGS. 5a and 5b are the SEM pictures of the worn surface of virgin WC/10 wt. % Co showing a brittle fracture. FIGS. 5c and 5d are the SEM pictures of worn surface of the carbon-implanted WC/10 wt. % Co showing a ductile fracture according to the preferred embodiment of the invention. The ion implantation improves the wear resistance. The friction coefficient of carbon-implanted nano-WC/10 Co decreased significantly to 0.17 from 0.33 of virgin samples.

Figure 6A:
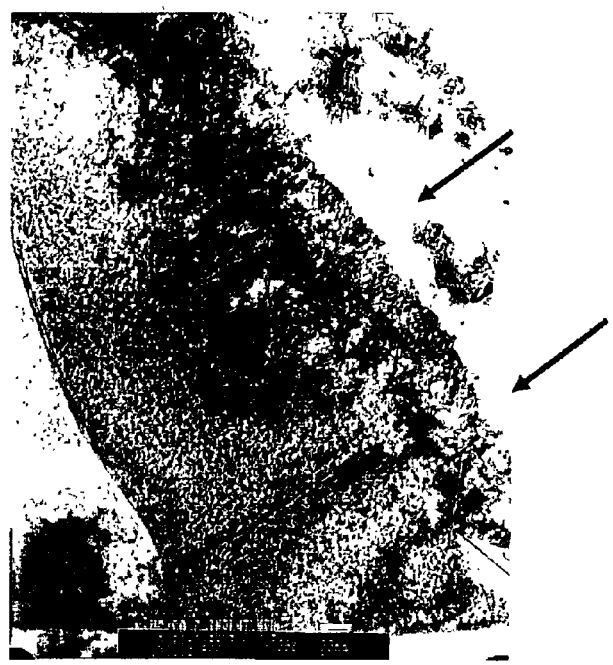
FIGS. 6a to 6c are the transmission electron microscope (TEM) pictures of carbon-implanted WC/10 wt. % Co according to the preferred embodiment of the invention.
Figure 6B:
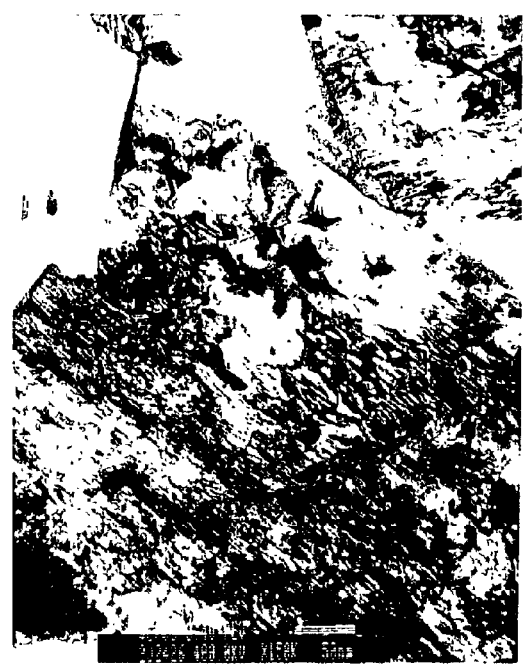
Figure 6C:

Transmission electron microscopy of implanted surface revealed highly dense dislocation entanglements, intersections of nano-twins/faults, dislocation cells and nano-subgrains in subsurface (100~150 nm thick). FIGS. 6a to 6c are the TEM pictures of carbon-implanted WC/10 wt. % Co. In FIGS. 6a and 6b, the cross-sectional image of the sample shows that the thickness of implantation zone is about 150 nm and the nanostructures comprising twins, stacking faults, high density of dislocations, and nano-subgrains are formed in the WC grain. In FIG. 6c, the electron microdiffraction of the WC grain reveals that subgrains of WC have preferred orientation or texture.

According to the present invention, the WC/Co material undergoes ion implantation to form nanostructures with improved mechanical properties. The nanostructured WC/Co material can be widely used as a mold, a wear tool, a drilling tool, or a cutting tool. In general, the high hardness of the material increases the machining rate. Materials with good wear resistance enable tools to have long life, and high fracture toughness enable materials to sustain large impact stress. Generation of heat in materials is greatly reduced because of the low friction coefficient. As well, a keen cutting tool can be fabricated from the materials with superfine grain size. The improved mechanical properties resulting from the nanostructures as mentioned above enable the ion-implanted nano-WC/Co material to be widely used in various applications. For example, the nanostructured WC/Co material can be used as a superfine cutting tool and a mold that can be applied in many fields, such as semiconductor devices, precision machinery, precision instruments, optical communications, consumer electronics, super-microfiber spinnerets, ink-jet head nozzle plates, and micromotor parts.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A fabrication method of a nanostructured tungsten carbide bulk material, comprising:

sintering tungsten carbide and cobalt nano-powders to form a tungsten carbide bulk; and performing implantation with the tungsten carbide bulk using $N^+$ and $Ar^+$ ions to form nanostructures in the sub-surface region of the tungsten carbide phase thereof, wherein the nanostructures comprise a plurality of dislocations, twins, stacking faults, dislocation cells, nano-subgrains with preferred orientation or texture, or a combination thereof.

2. The method as claimed in claim 1, wherein a dosage of $N^+$ is approximately $2 \times 10^{17}$ ions/cm$^2$, and a dosage of $Ar^+$ is approximately $10^{15}$ ions/cm$^2$.

3. The method as claimed in claim 1, wherein the depth of the sub-surface region is about 1~500 nanometers.

4. The method as claimed in claim 1, wherein microstress in the sub-surface region is about 1~10 GPa.

5. The method as claimed in claim 1, wherein the surface roughness of the tungsten carbide is about 1~15 nanometers.

6. The method as claimed in claim 1, further comprising diamond polishing of the tungsten carbide bulk until the surface thereof develops a mirror finish before ion implantation.

* * * * *